United States Patent [19]

Kanaka et al.

[11] Patent Number: 5,221,729
[45] Date of Patent: Jun. 22, 1993

[54] POLYESTER WHICH EXHIBITS MELT ANISOTROPY

[75] Inventors: Keiichi Kanaka; Noriyuki Hayashi; Toshihiro Kobashi; Yukihiko Kageyama; Kenji Hijikata, all of Shizuoka, Japan

[73] Assignee: Polyplastics Co., Ltd., Osaka, Japan

[21] Appl. No.: 763,423

[22] Filed: Sep. 20, 1991

[30] Foreign Application Priority Data

Sep. 20, 1990 [JP]  Japan ................... 2-251336

[51] Int. Cl.$^5$ ............ C08G 63/00; C08G 63/02; C08G 65/38; C08L 67/00
[52] U.S. Cl. .................. 528/176; 524/599; 524/601; 524/604; 524/605; 528/194; 528/219; 528/272
[58] Field of Search ............ 528/176, 194, 219, 272, 528/599; 524/601, 604, 605

[56] References Cited

U.S. PATENT DOCUMENTS

| | | | |
|---|---|---|---|
| 4,035,356 | 7/1977 | Jackson, Jr. et al. | 528/190 |
| 4,067,852 | 1/1978 | Calundann | 528/190 |
| 4,083,829 | 4/1978 | Calundann et al. | 528/190 |
| 4,118,372 | 10/1978 | Schaefgen | 528/190 |
| 4,130,545 | 12/1978 | Calundann | 528/173 |
| 4,181,792 | 1/1980 | Jackson, Jr. et al. | 528/190 |
| 4,219,461 | 8/1980 | Calundann | 528/143 |
| 4,256,624 | 3/1981 | Calundann | 528/173 |
| 4,318,841 | 3/1982 | East et al. | 524/605 |
| 4,318,842 | 3/1982 | East et al. | 524/599 |
| 4,337,191 | 6/1982 | Favstritsky | 524/605 |
| 4,375,530 | 3/1983 | Hay et al. | 524/599 |
| 4,431,770 | 2/1984 | East et al. | 524/599 |
| 4,473,682 | 9/1984 | Calundann et al. | 524/605 |
| 4,684,712 | 8/1987 | Ueno et al. | 528/190 |
| 4,746,694 | 5/1988 | Charbonneau et al. | 524/602 |
| 4,746,722 | 5/1988 | Iida et al. | 528/193 |
| 4,891,418 | 1/1990 | Hara et al. | 528/195 |
| 4,983,713 | 1/1991 | Hayashi et al. | 528/190 |
| 5,015,722 | 5/1991 | Charbonneau et al. | 528/190 |

OTHER PUBLICATIONS

"*Macromolecules*" vol. 16, No. 7, Jul. 1983, J. Jackson. Eastman Kodack Company.
"*Polymer*", 1991, vol. 32, No. 12 F. S. Balta Callega et al.
"*Polymer*", 1991, vol. 32, No. 9 D. Chen et al.

*Primary Examiner*—John Kight, III
*Assistant Examiner*—T. Mosley
*Attorney, Agent, or Firm*—Burns, Doane, Swecker & Mathis

[57] ABSTRACT

A polyester exhibiting melt anisotropy and improved thermal stability is provided which consists essentially of structural units represented by the formulas (i) to (iii), wherein:

(i) is $-O-Ar_1-\overset{O}{\underset{\|}{C}}-$, (ii) is $-\overset{O}{\underset{\|}{C}}-Ar_2-\overset{O}{\underset{\|}{C}}-$, and (iii) is $-O-X_3-O-$, wherein $Ar_1$ is 1,4-phenylene and/or 2,6-naphthalene, $Ar_2$ is 2,6-naphthalene and/or 2,7-naphthalene, and $X_3$ is an aliphatic hydrocarbon containing 2 to 8 carbon atoms.

13 Claims, No Drawings

POLYESTER WHICH EXHIBITS MELT ANISOTROPY

This invention relates to a polyester which exhibits melt anisotropy and possesses excellent thermal stability and processability.

BACKGROUND OF THE INVENTION

Polyester which exhibits melt anisotropy has good workability in molding despite its high heat resistance, and therefore has found widespread use in various industrial fields.

Above all, a liquid crystal polyester as a copolymer of hydroxybenzoic acid with polyethylene terephthalate appear to be the most promising with an additional economic advantage. However, such a liquid crystal polyester is disadvantageous in that the homopolymer component of the hydroxybenzoic acid tends to cause phase separation and that the thermal deformation temperature is low and the thermal stability during melt retention is poor. Many different attempts have been made to solve these deficiencies, but none have proven to be completely effective to date.

SUMMARY OF THE INVENTION

Under the circumstances, the present inventors have made intensive research in an effort to develop a polymer having excellent thermal stability as well as fluidity and processability at least comparable to those of the hydroxybenzoic acid-polyethylene terephthalate copolymer. As a result, they have now completed this invention on the basis of the finding that a polymer of a specific skeleton consisting of a combination of specific structural units exhibits both excellent fluidity and thermal stability.

Thus, the present invention is concerned with a polyester which exhibits melt anisotropy consisting essentially of structural units represented by the formulas (i) to (iii), where:

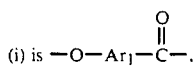

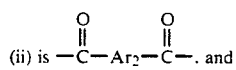

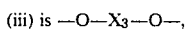

and wherein $Ar_1$ is 1,4-phenylene and/or 2,6-naphthalene, $Ar_2$ is 2,6-naphthalene and/or 2,7-naphthalene, and $X_3$ is an aliphatic hydrocarbon containing 2 to 8 carbon atoms.

While Ar in the formula (i) is 1,4-phenylene and/or 2,6-naphthalene, 1,4-phenylene is preferred where economy is a consideration. In using it, a small amount of 2,6-naphthalene may also be used when desired. By "a small amount" is meant 10 mol% or less of the total amount of the structural unit $Ar_1$. Desirably, $Ar_1$ accounts for 10 to 90%, more desirably for 20 to 80%, of the total structural units of the polymer. If the amount is below this range the fluidity increases excessively, while if it is above the range the polymer tends to become more heterogeneous with more insoluble and infusible matter.

$Ar_2$ in the formula (ii) is 2,6-naphthalene and/or 2,7-naphthalene. Either alone or both as a mixture may be used to such an extent that it does not interrupt the balance between fluidity and thermal stability to which the invention is directed. A desirable form of use is a mixed system of 2,6-naphthalene and 2,7-naphthalene, in which 2,6-naphthalene accounts for 20 to 80 mol% of the total amount. A substantial deviation from this range would impair the balance among physical properties.

$X_3$ in the formula (iii) is an aliphatic hydrocarbon containing 2 to 8 carbon atoms. Particularly desirable is one or more members selected from among $-CH_2CH_2-$, $-CH_2CH_2CH_2CH_2-$, and $-CH_2CH_2CH_2CH_2CH_2CH_2CH_2CH_2-$.

Besides the major structural units described above, various other structural units may be added as desired, although the unit or units thus added must account for at most 10 mol% of the total amount of the structural units. Those extra structural units include non-para-substituted aromatic structural units that do not show linearity, branched component structural units, ionic group-containing structural units, monofunctional structural units as molecular weight modifiers, and chain extenders which subsequently are incorporated.

In order to embody those structural units, various compounds ordinarily capable of forming esters are used. The compounds in which the ester residue shown in the formula (i) is present are p-hydroxybenzoic acid, 2-hydroxy-6-naphthoic acid, and their derivatives, i.e., esters, such as methyl, ethyl, propyl, butyl, and phenyl, their acid chlorides and other halides, acid esters, such as of acetic, propionic, or benzoic acid, and the like.

The compounds in which the ester residue shown in the formula (ii) is present include diesters of acids, such as dimethyl, diethyl, dibutyl, and diphenyl esters of 2,6-naphthalene and 2,7-naphthalenedicarboxylic acids, and dichlorides and other halides of those acids.

Among the compounds in which the ester residue shown in the formula (iii) is present are ethylene glycol, propylene glycol, 1,4-butylene glycol, 1,6-hexane glycol, 1,4-cyclohexanedimethanol, 1,8-octanediol, and their derivatives capable of forming an ester.

The ester-forming compounds for supplying the structural units of the polyester are as follows.

Examples of the ester-forming compounds are, the non-para-substituted aromatic compounds that do not show linearity, isophthalic acid and its derivatives capable of forming an ester, i.e., dimethyl, diethyl, dibutyl, diphenyl, and other esters of isophthalic acid, halides such as acid chlorides, and m-hydroxybenzoic acid and its derivatives capable of forming esters, i.e., esters of acetic, propionic, and benzoic acids, esters of methanol, ethanol, propanol, butanol, phenol, etc., and halogen compounds such as acid chlorides. Resorcinol, bisphenols having flexible bonds in the compounds, such as 4,4'-dihydroxydiphenylpropane, 4,4'-dihydroxydiphenyl sulfone, 4,4'-dihydroxydiphenyl ketone, 4,4'-dihydroxydiphenyl ether, and 4,4'-dihydroxydiphenyl-p-bispropylidenephenylene, and derivatives thereof, i.e., acid diesters of acetic, propionic, benzoic, and other acids, can be used as well.

Branched components can be used insofar as they impart moldability as do substantially linear polymers. The structural units are polyfunctional ester-forming compounds, i.e., polyfunctional carboxylic acids, such as trimesic, trimellitic, and pyromellitic acids, and their derivatives, such as methyl, ethyl, butyl, phenyl, and other polyfunctional esters, acid chlorides and other polyfunctional halides, and partial or total acid anhydrides. Polyfunctional hydroxy compounds and their derivatives also come within this category.

Typical of ionic group-containing compounds is sodium salt of dimethyl sulfoisophthalate. The use of a molecular weight modifier or the blocking for the end of a molecular chain is a technique well known to those skilled in the art. The compounds which serve to achieve this end are typified by monofunctional epoxy compounds, isocyanate compounds, and ester-forming compounds. Phenyl glicydyl ether and acetoxy-p-phenylphenol are typical examples.

Chain extenders that can be added later are, for example, diphenyl carbonate, diphenyl terephthalate, bisoxazoline, bisepoxide, diisocyanate, and carbodiimide.

From these compounds the polymer of the invention is prepared using any of various polymerization techniques well known to one skilled in the art.

For instance, a polymer or oligomer composed of the structural units represented by the formulas (ii) and (iii) is made in advance, and further polymerization is carried out by the addition of a compound which supplies the structural unit of the formula (i). Another method involves the simultaneous feed and polymerization of the compounds which supply the structural units of the formulas (i), (ii), and (iii).

The polymerization is conducted by direct polymerization or transesterification. The compounds capable of forming esters may be used as they are in the polymerization. Alternatively, they may be converted from the precursors into ester-forming derivatives in the prepolymerization stage in the same reactor or prior to addition to the reactor.

The mode of polymerization includes solution, melt, and slurry polymerization.

Various catalysts may be employed for the polymerization. Typical of them are dialkyltin oxides, diaryltin oxides, titanium dioxide, alkoxytitanium silicates, titanium alcoholates, alkali and alkaline earth metal salts of carboxylic acids, and Lewis acids such as $BF_3$.

The amount of the catalyst to be used is usually about 0.001 to about 1% by weight, preferably about 0.01 to about 0.2% by weight, on the basis of the total monomer weight.

The polymer prepared by the abovedescribed polymerization procedure may further be subjected to solid phase polymerization, which involves heating under reduced pressure or in an inert gas, for increasing the molecular weight.

To be a liquid crystal polymer which exhibits optical anisotropy when melted is an indispensable quality for the polymer of the invention to attain easy processability. The melt anisotropic property can be confirmed by a conventional polarimetric method using a crossed nicol polarizer. More specifically, melt anisotropy is proven by melting a sample placed on a Leitz hot stage and observing the melt in a nitrogen atmosphere under a Leitz polarization microscope at the magnification of 40X. The polymer of the invention is optically anisotropic and allows light transmission through it when placed between the crossed polarizers. Polarized light passes through the sample when the latter is optically anisotropic, even though kept still in a molten state.

Possible processability criteria for the product of the invention are liquid crystallinity and the melting point (the temperature at which liquid crystallinity is first exhibited). Whether the product shows liquid crystallinity or not depends largely upon its melt flow properties. It is essential for the polyester of the invention to exhibit liquid crystallinity when melted.

Nematic liquid crystal polymers are extremely reduced in viscosity above the melting point. In general, therefore, it is an indication of processability that a polymer becomes liquid crystalline at or above its melting point. From the standpoint of heat resistance, the melting point (at which liquid crystallinity develops) is desired to be as high as possible. Actually, a desirable level is about 350° C. or below when factors such as the thermal deterioration during melting of the polymer and the heating capacity of a molding machine are taken into account. More desirably, the melting point is 300° C. or below. It is also desirable that the melt viscosity of the resin at a temperature of the melting point plus at least 10° C. be $1 \times 10^6$ poises or below under a shear stress of 100 sec$^{-1}$. Preferably the viscosity is $10^4$ poises or below. Such a melt viscosity generally is realized by the provision of liquid crystallinity.

The polyester of the invention may contain various inorganic and organic fillers in fibrous, granular, particulate, flaky, or platy form, depending on the intended use.

Examples of the fibrous fillers are inorganic fibrous substances such as the fibers of glass, asbestos, silica, silica-alumina, alumina, zirconia, boron nitride, silicon nitride, boron, and potassium titanate; and also metallic fibrous substances such as the fibers of stainless steel, aluminum, titanium, copper, and brass. The most typical fibrous filler is glass fiber. High-melting organic fibrous substances of polyamides, fluororesins, polyester resins, acrylic resins, etc. may be used as well.

The granular or particulate fillers include carbon black, graphite, silica, quartz powder, glass beads, milled glass fiber, glass balloon, glass powder, and silicates such as calcium silicate, aluminum silicate, kaolin, talc, clay, diatom earth and wollastonite; iron oxide, titanium oxide, zinc oxide, antimony trioxide, alumina, and other metal oxides; carbonates of metals, such as calcium carbonate and magnesium carbonate; sulfates of metals, such as calcium sulfate and barium sulfate; and also ferrites, silicon carbide, silicon nitride, boron nitride, and various metal powders.

The flaky or platy fillers include mica, glass flakes, and various metal foils.

Among exemplary organic fillers are aromatic polyester fibers, liquid crystal polymer fibers, aromatic polyamide and polyimide fibers, and other heat-resistant, high-strength synthetic fibers.

These organic and inorganic fillers ca be used singly or in a combination of two or more. A combination of a fibrous filler with a granular or flaky filler is particularly desirable because it combines mechanical strength, dimensional accuracy, electrical properties, etc. The amount of the inorganic filler or fillers is not more than 95% by weight, preferably 1 to 80% by weight, on the basis of the total amount of the composition.

In using such a filler or fillers, it is desirable, where necessary, to use also a binder or surface treatment.

The polyester according to the invention may further contain as an auxiliary component another thermoplastic resin provided it is not detrimental to the realization of the object of the invention.

Examples of the thermoplastic resins useful for this purpose are polyolefins such as polyethylene and polypropylene; aromatic polyesters composed of a diol and an aromatic dicarboxylic acid, such as polyethylene terephthalate or polybutylene terephthalate, or oxycarboxylic acid; and polyacetals (homo- or copolymers), polystyrenes, polyvinyl chlorides, polyamides, polycarbonate, ABS, polyphenylene oxides, polyphenylene sulfides, and fluororesins. These thermoplastic resins may be used also as a mixture of two or more.

In the practice of the invention various additives may be used in the manner well known to those skilled in the art. Examples are antistatic agent, antioxidant, ultraviolet absorbers, and dyes.

ADVANTAGES OF THE INVENTION

The polyester which is obtained in accordance with the invention and which exhibits melt anisotropy has such outstanding processability and good thermal stability that it can be effectively molded into fibers, films, sheets, and other products such as injection molded or extruded articles.

These molded articles are advantageously used in connectors, printed circuit boards, surface mounted components, and other applications in the electronics field that require a good balance between fluidity and thermal stability.

EXAMPLES

The present invention will now be described in more detail in connection with the following Examples which are not intended to be limiting.

EXAMPLE 1

A reactor equipped with an agitator, nitrogen supply line, and distilling tube was charged with 35 parts by mole of dimethyl 2,6-naphthalenedicarboxylate, 15 parts by mole of dimethyl 2,7-naphthalenedicarboxylate, 102 parts by mole of ethylene glycol, and 0.01% by weight of magnesium acetate on the basis of the total amount of the feed. The mixture was allowed to react in a stream of nitrogen at 180 to 240° C. to distill out methanol. After the removal of methanol by distillation, 500 ppm of titanium tetrabutoxide on the basis of the total amount of the feed was added and the temperature was raised. The mixture, following agitation for some time, was allowed to react in a high vacuum of 0.5 mmHg or below for 45 minutes. The reaction was terminated by restoring the ordinary pressure inside the reactor with nitrogen.

With the polymer thus obtained, its inherent viscosity at 40° C. was determined using a 1:1 mixed solvent of pentachlorophenol and o-chlorophenol. The value was 0.50 dl/g. Its melting point as measured with a differential thermal analyzer manufactured by MAC Science Co., Ltd was 243° C.

The same reactor as that used in polymerizing the starting material polymer was charged with 30 mol% of the polymer on the basis of the total structural units, 70 mol% of p-acetoxybenzoic acid, and 0.05% by weight of dibutyltin oxide on the basis of the total feed. The inside of the reactor was purged with nitrogen in a vacuum. The mixture was agitated in a nitrogen atmosphere at 275° C. to distill out acetic acid gradually from the vessel. When the distillation of acetic acid was almost complete after 60 minutes, a high vacuum of 0.3 mmHg was applied and agitation was continued for 3 hours to conclude the reaction.

The pressure inside the reactor was returned to the ordinary level with nitrogen and, after cooling, the resultant polymer was taken out.

The inherent viscosity and melting point of the polymer, measured by the same procedures as those used above, were 0.58 dl/g and 195° C., respectively. This polymer showed a nematic liquid crystal pattern above its melting point when observed under a crossed nicol prism microscope equipped with a hot stage manufactured by Linkam Scientific Instruments Ltd.

The melt viscosity of this polymer under a shear stress of $10^2 \sec^{-1}$ was measured at a temperature 20° C. above the melting point with a Capirograph manufactured by Toyo Seiki Seisaku-Sho. The measured value was $2 \times 10^2$ poises.

Tensile test pieces were made from this polymer and tested at 210° C. using a tester "Minishot Model 2" manufactured by Yokohama Chemix Co., Ltd. The tensile strength was 920 kg/cm$^2$, tensile modulus 52000 kg/cm$^2$, and the elongation was 3.5%. The melt retention at Tm plus 20° C. was observed for 10 minutes, when the viscosity-drop holding rate was 81%, indicating a good thermal stability. Table 1 gives a summary of the results.

EXAMPLE 2

From the composition shown in Table 1, a final polymer was obtained and evaluated in the same manner as that of Example 1. The results are also given in Table 1.

COMPARATIVE EXAMPLE 1

In the final stage of preparation of a starting polymer from the composition shown in Table 1, a reaction in a high vacuum was conducted at 285° C. for 45 minutes; otherwise the same procedure as that described in Example 1 was followed (except that the molding temperature was 235° C.). The final polymer thus obtained was evaluated in the same way. Table 1 shows the results.

COMPARATIVE EXAMPLE 2

With the composition shown in Table 1 the procedure of Example 1 was repeated to obtain and evaluate a final polymer. The results are given in Table 1.

EXAMPLE 3

A starting polymer was obtained from the composition of Table 1 in the same manner as that of Example 1 with the exception that a reaction in a high vacuum was conducted at 330° C. for 45 minutes in the final stage of preparation of the starting polymer. The same reactor as that used in polymerization for the preparation of the starting polymer was charged with 30 mol% of fine powder of the resultant polymer on the basis of the total structural units to be obtained, 70 mol% of p-acetoxybenzoic acid, 0.05% by weight of dibutyltin oxide on the basis of the total amount of the feed excluding acetic acid, and such an excess amount of acetic acid as to slurry the mixture. The reaction vessel in a vacuum was purged with nitrogen. The mixture was agitated in a nitrogen atmosphere at 275° C. to distill away acetic acid gradually from the vessel. The temperature was raised to 330° C. over 80 minutes when the distillation of acetic acid was almost complete. The agitation was then continued in a high vacuum of 0.3 mmHg for 3 hours and the reaction was concluded.

An ordinary pressure was restored with nitrogen inside the reactor and, after cooling, the resultant polymer was taken out. Except for the use of a molding temperature of 270° C., the procedure of Example 1 was repeated to obtain and evaluate a final polymer. Table 1 shows the results.

EXAMPLE 4

With the composition shown in Table 1 the procedure of Example 1 was repeated to prepare and evaluate a final polymer. The results are given in Table 1.

COMPARATIVE EXAMPLE 3

During the preparation of a starting polymer from the composition listed in Table 1, a reaction was carried out in a high vacuum and at 370° C. for 45 minutes; otherwise the same procedure as that of Example 3 was followed to carry on a reaction. In the course of preparation of a liquid crystal polymer a gel developed, and only an insoluble and infusible product resulted.

COMPARATIVE EXAMPLE 4

From the composition in Table 1 a final polymer was obtained and evaluated following the procedure of Example 3. Table 1 gives the results.

EXAMPLES 5 TO 6

Final polymers were obtained from the compositions in Table 1 and evaluated in the same way as that of Example 1. Table 1 gives the results.

COMPARATIVE EXAMPLE 5

A polyethylene terephthalate (PET) with an inherent viscosity of 0.40 dl/g was prepared in the usual manner. Using 30 mol% of this PET on the basis of the total structural units to be obtained and 70 mol% of p-acetoxybenzoic acid, polymerization was carried out as in Example 1.

The resultant polymer showed an inherent viscosity of 0.54 dl/g and a melting point of 210° C. Its melt viscosity was $2 \times 10^3$ poises and the viscosity holding rate after retention wa 41%.

These results indicate that the polymer obtained in conformity with the invention is superior in fluidity and thermal stability to the liquid crystal polymer made from hydroxybenzoic acid and polyethylene terephthalate.

EXAMPLE 7

The polymer prepared in Example 1 was mixed with 30% by weight of glass fiber and extruded through an extruder. Tensile test pieces were made likewise and subjected to tensile tests. The results are given in Table 1.

TABLE 1

| | Composition of starting polymer | | | | Product polymer ① | | Trial compn of LC polymer | | Product LC polymer | |
|---|---|---|---|---|---|---|---|---|---|---|
| | dimethyl phthalate (mol part) | | | | Tm | | ① | p-acetoxy-benzoic acid | Tm | |
| | 26-pan | 27-pan | glycol | (mol part) | (°C.) | ηinh | (mol %) | (mol %) | (°C.) | ηinh |
| Ex. 1 | 35 | 15 | ethylene | 102 | 243 | 0.50 | 30 | 70 | 195 | 0.58 |
| Ex. 2 | 15 | 35 | glycol | 102 | 227 | 0.45 | 30 | 70 | 176 | 0.56 |
| Comp. Ex. 1 | 50 | — | | 102 | 270 | 0.51 | 30 | 70 | 224 | 0.71 |
| Comp. Ex. 2 | — | 50 | | 102 | 220 | 0.48 | 30 | 70 | 172 | 0.60 |
| Ex. 3 | 35 | 15 | cyclo- | 100 | 310 | 0.43 | 30 | 70 | 262 | 0.81 |
| Ex. 4 | 15 | 35 | hexane | 100 | 297 | 0.41 | 30 | 70 | 247 | 0.79 |
| Comp. Ex. 3 | 50 | — | dimethanol | 100 | 351 | 0.52 | 30 | 70 | 302 | 0.42 |
| Comp. Ex. 4 | — | 50 | | 100 | 300 | 0.49 | 30 | 70 | 251 | 0.61 |
| Ex. 5 | 35 | 15 | tri- | 101 | 220 | 0.42 | 30 | 70 | 180 | 0.71 |
| Ex. 6 | 15 | 35 | butylene glycol | 101 | 210 | 0.40 | 30 | 70 | 165 | 0.71 |
| Comp. Ex. 5 | dimethyl terephthalate 50 | | ethylene glycol 102 | | 258 | 0.40 | 30 | 70 | 210 | 0.52 |
| Ex. 7 | polymer of Example 1 mixed with 30 wt % of glass fiber | | | | | | | | | — |

| | Viscosity under shear of $10^2 sec^{-1}$ at Tm + 20° C. (poise) | Properties of solid substance | | | Thermo-stable visc-holdg rate (%) | Remarks |
|---|---|---|---|---|---|---|
| | | tens. Str. (kg/cm²) | tensile modulus (kg/cm²) | elong. (%) | | |
| Ex. 1 | $2 \times 10^2$ | 920 | 52000 | 3.5 | 81 | |
| Ex. 2 | $2 \times 10^2$ | 870 | 48000 | 4.0 | 85 | |
| Comp. Ex. 1 | $3 \times 10^3$ | 750 | 51000 | 1.0 | 62 | gel-like formation on liquid crystallization |
| Comp. Ex. 2 | $1 \times 10^4$ | 610 | 42000 | 1.0 | 64 | no liquid crystallinity |
| Ex. 3 | $5 \times 10^2$ | 970 | 67000 | 3.5 | 85 | |
| Ex. 4 | $6 \times 10^2$ | 940 | 62000 | 4.0 | 83 | |
| Comp. Ex. 3 | — | — | — | — | — | gelation occurred on liquid crystallization |
| Comp. Ex. 4 | $2 \times 10^4$ | 640 | 40000 | 1.0 | 67 | no liquid crystallization |
| Ex. 5 | $1.5 \times 10^2$ | 910 | 49000 | 3.0 | 87 | |
| Ex. 6 | $2 \times 10^2$ | 890 | 48000 | 5.0 | 84 | |
| Comp. Ex. 5 | $2 \times 10^3$ | 960 | 75000 | 2.5 | 61 | |

TABLE 1-continued

| Ex. 7 | — | 1130 | 92000 | 2.5 | — |

Although the invention has been described with preferred embodiments it is to be understood that variations and modifications may be employed without departing from the concept of the invention as defined in the following claims.

We claim:

1. A polyester which exhibits melt anisotropy consisting essentially of the structural units represented by the formulas (i) to (iii), where:

(i) is $-O-Ar_1-\overset{O}{\underset{\|}{C}}-$, (ii) is $-\overset{O}{\underset{\|}{C}}-Ar_2-\overset{O}{\underset{\|}{C}}-$, and (iii) is $-O-X_3-O-$, and wherein $Ar_1$ is selected from the group consisting of 1,4-phenylene, 2,6-naphthalene, and mixtures of these, $Ar_2$ is a mixture of 2,6-naphthalene and 2,7-naphthalene wherein the quantity of 2,6-naphthalene to the total amount of $Ar_2$ is between 20 to 80 mole percent, and $X_3$ is derived from a diol selected from the group consisting of ethylene glycol, propylene glycol, 1,4-butylene glycol, 1,6-hexane glycol, 1,4-cyclohexanedimethanol, 1,8-octanediol, their ester-forming derivatives, and mixtures of the foregoing.

2. A polyester of claim 1 wherein $Ar_1$ in formula (i) is 1,4-phenylene.

3. A polyester of claim 1 wherein $Ar_1$ in formula (i) is 2,6-naphthalene.

4. A polyester of claim 1 wherein $X_3$ of unit (iii) is an aliphatic hydrocarbon selected from the group consisting of $-CH_2CH_2-$, $-CH_2CH_2CH_2CH_2-$, $-CH_2CH_2CH_2CH_2CH_2CH_2CH_2CH_2-$, and mixtures of the foregoing.

5. A polyester of claim 1 which exhibits melt anisotropy at 350° C. or below.

6. A polyester of claim 1 wherein unit (i) is present in an amount of 10 to 90 mole percent of the total amount of structural units.

7. A polyester of claim 1 wherein unit (i) is present in an amount of 20 to 80 mole percent of the total amount of structural units.

8. A polyester of claim 1 wherein unit (i) is present in an amount of 70 mole percent of the total amount of structural units.

9. A polyester of claim 1 which has incorporated therein a filler in an amount of not more than 95 percent by weight based upon the total weight of the composition.

10. A polyester of claim 1 which has incorporated therein a filler in an amount of 1 to 80 percent by weight based upon the total weight of the composition.

11. A polyester of claim 9 wherein the filler is glass fiber.

12. A polyester of claim 10 wherein the filler is glass fiber.

13. A polyester of claim 1 which has incorporated therein glass fiber in an amount of 30 percent by weight based upon the total weight of the composition.

* * * * *